United States Patent
Afsahi (10) Patent No.: US 7,991,375 B2
(45) Date of Patent: Aug. 2, 2011

(54) RFIC WITH HIGH POWER PA

(75) Inventor: Ali Afsahi, San Diego, CA (US)

(73) Assignee: Broadcom Corporation, Irvine, CA (US)

( * ) Notice: Subject to any disclaimer, the term of this patent is extended or adjusted under 35 U.S.C. 154(b) by 1000 days.

(21) Appl. No.: 11/732,272

(22) Filed: Apr. 3, 2007

(65) Prior Publication Data

US 2008/0136516 A1  Jun. 12, 2008

Related U.S. Application Data (60) Provisional application No. 60/868,818, filed on Dec. 6, 2006, provisional application No. 60/868,881, filed on Dec. 6, 2006, provisional application No. 60/868,878, filed on Dec. 6, 2006.

(51) Int. Cl.
*H04B 1/26* (2006.01)

(52) U.S. Cl. ............ 455/320; 455/127.3; 455/341; 375/219; 330/124 R (58) Field of Classification Search .......... 455/91, 455/102, 103, 107, 113, 127.1–3, 313, 318, 455/319, 320, 323, 334, 341; 375/219, 297; 330/124 R, 307

See application file for complete search history.

(56) References Cited

U.S. PATENT DOCUMENTS

| | | | |
|---|---|---|---|
| 5,973,568 A * | 10/1999 | Shapiro et al. | 330/295 |
| 2004/0051584 A1* | 3/2004 | Choi | 330/129 |
| 2005/0110573 A1* | 5/2005 | Ohnishi et al. | 330/295 |
| 2006/0028269 A1* | 2/2006 | Chen | 330/51 |
| 2006/0232355 A1* | 10/2006 | Park et al. | 333/24 R |

OTHER PUBLICATIONS

Ichiro Aoki, Scott D. Kee, David B. Rutledge, and Ali Hajimiri; "Fully Integrated CMOS Power Amplifier Design Using the Distributed Active-Transformer Architecture," IEEE Journal of Solid-State Circuits, vol. 37, No. 3, Mar. 2002, pp. 371-383.

\* cited by examiner

*Primary Examiner* — Nhan Le
(74) *Attorney, Agent, or Firm* — Garlick Harrison & Markison; Timothy W. Markison; Shayne X. Short (57) ABSTRACT

A radio frequency (RF) front-end includes a plurality of power amplifier modules and a plurality of impedance matching circuits. Each of the plurality of impedance matching circuits includes an input connection and an output connection, wherein outputs of the plurality of power amplifier modules are coupled to corresponding input connections of the plurality of impedance matching circuits to provide a desired loading of the plurality of power amplifier modules and wherein the output connections of the plurality of impedance matching circuits are coupled together to add power of the plurality of power amplifiers.

12 Claims, 7 Drawing Sheets

RFIC WITH HIGH POWER PA

CROSS REFERENCE TO RELATED PATENTS/PATENT APPLICATIONS

This patent application is claiming priority under 35 USC §119 to three provisionally filed patent applications:
(1) METHOD AND SYSTEM FOR SIGNAL PROCESSING IN WIRELESS COMMUNICATIONS, having a provisional filing date of Dec. 6, 2006, and a provisional Ser. No. 60/868,818;
(2) FUNCTIONALITIES OF A CHIP, having a provisional filing date of Dec. 6, 2006, and a provisional Ser. No. 60/868,881; and
(3) METHOD AND SYSTEM FOR SIGNAL PROCESSING, having a provisional filing date of Dec. 6, 2006, and a provisional Ser. No. 60/868,878.

STATEMENT REGARDING FEDERALLY SPONSORED RESEARCH OR DEVELOPMENT

Not Applicable

INCORPORATION-BY-REFERENCE OF MATERIAL SUBMITTED ON A COMPACT DISC

Not Applicable

BACKGROUND OF THE INVENTION

1. Technical Field of the Invention

This invention relates generally to wireless communication systems and more particularly to wireless communication devices having an integrated circuit operating within such systems.

2. Description of Related Art

Communication systems are known to support wireless and wire lined communications between wireless and/or wire lined communication devices. Such communication systems range from national and/or international cellular telephone systems to the Internet to point-to-point in-home wireless networks. Each type of communication system is constructed, and hence operates, in accordance with one or more communication standards. For instance, wireless communication systems may operate in accordance with one or more standards including, but not limited to, IEEE 802.11, Bluetooth, advanced mobile phone services (AMPS), digital AMPS, global system for mobile communications (GSM), code division multiple access (CDMA), local multi-point distribution systems (LMDS), multi-channel-multi-point distribution systems (MMDS), radio frequency identification (RFID), Enhanced Data rates for GSM Evolution (EDGE), General Packet Radio Service (GPRS), and/or variations thereof.

Depending on the type of wireless communication system, a wireless communication device, such as a cellular telephone, two-way radio, personal digital assistant (PDA), personal computer (PC), laptop computer, home entertainment equipment, RFID reader, RFID tag, et cetera communicates directly or indirectly with other wireless communication devices. For direct communications (also known as point-to-point communications), the participating wireless communication devices tune their receivers and transmitters to the same channel or channels (e.g., one of the plurality of radio frequency (RF) carriers of the wireless communication system or a particular RF frequency for some systems) and communicate over that channel(s). For indirect wireless communications, each wireless communication device communicates directly with an associated base station (e.g., for cellular services) and/or an associated access point (e.g., for an in-home or in-building wireless network) via an assigned channel. To complete a communication connection between the wireless communication devices, the associated base stations and/or associated access points communicate with each other directly, via a system controller, via the public switch telephone network, via the Internet, and/or via some other wide area network.

For each wireless communication device to participate in wireless communications, it includes a built-in radio transceiver (i.e., receiver and transmitter) or is coupled to an associated radio transceiver (e.g., a station for in-home and/or in-building wireless communication networks, RF modem, etc.). As is known, the receiver is coupled to an antenna and includes a low noise amplifier, one or more intermediate frequency stages, a filtering stage, and a data recovery stage. The low noise amplifier receives inbound RF signals via the antenna and amplifies then. The one or more intermediate frequency stages mix the amplified RF signals with one or more local oscillations to convert the amplified RF signal into baseband signals or intermediate frequency (IF) signals. The filtering stage filters the baseband signals or the IF signals to attenuate unwanted out of band signals to produce filtered signals. The data recovery stage recovers raw data from the filtered signals in accordance with the particular wireless communication standard.

As is also known, the transmitter includes a data modulation stage, one or more intermediate frequency stages, and a power amplifier. The data modulation stage converts raw data into baseband signals in accordance with a particular wireless communication standard. The one or more intermediate frequency stages mix the baseband signals with one or more local oscillations to produce RF signals. The power amplifier amplifies the RF signals prior to transmission via an antenna.

While transmitters generally include a data modulation stage, one or more IF stages, and a power amplifier, the particular implementation of these elements is dependent upon the data modulation scheme of the standard being supported by the transceiver. For example, if the baseband modulation scheme is Gaussian Minimum Shift Keying (GMSK), the data modulation stage functions to convert digital words into quadrature modulation symbols, which have a constant amplitude and varying phases. The IF stage includes a phase locked loop (PLL) that generates an oscillation at a desired RF frequency, which is modulated based on the varying phases produced by the data modulation stage. The phase modulated RF signal is then amplified by the power amplifier in accordance with a transmit power level setting to produce a phase modulated RF signal.

As another example, if the data modulation scheme is 8-PSK (phase shift keying), the data modulation stage functions to convert digital words into symbols having varying amplitudes and varying phases. The IF stage includes a phase locked loop (PLL) that generates an oscillation at a desired RF frequency, which is modulated based on the varying phases produced by the data modulation stage. The phase modulated RF signal is then amplified by the power amplifier in accordance with the varying amplitudes to produce a phase and amplitude modulated RF signal.

As yet another example, if the data modulation scheme is x-QAM (16, 64, 128, 256 quadrature amplitude modulation), the data modulation stage functions to convert digital words into Cartesian coordinate symbols (e.g., having an in-phase signal component and a quadrature signal component). The IF stage includes mixers that mix the in-phase signal component with an in-phase local oscillation and mix the quadrature signal component with a quadrature local oscillation to produce two mixed signals. The mixed signals are summed together and filtered to produce an RF signal that is subsequently amplified by a power amplifier.

An issue with the above described transmitters is providing a power amplifier that has sufficient gain and power and that can be implemented on an integrated circuit (IC). In general, the power of a power amplifier (PA) can be expressed as $P=V^2/2R$, where V is the supply voltage and R is the load impedance. With IC fabrication processes shrinking, the supply voltage requirement is being lowered, which reduced the power a PA can deliver. If the load impedance is lowered to increase the power of a PA, several issues arise. One issue is that impedance matching becomes more difficult leading to impedance mismatches, which makes the transmission of an RF signal less efficient. Another issue is that larger devices, which have larger parasitic components, are required to provide the higher power levels. The larger parasitic components require a larger PA driver and make the transmission of an RF signal less efficient.

Therefore, a need exists for an integrated circuit (IC) that includes a high power PA module that overcomes at least some of the issues mentioned above.

BRIEF SUMMARY OF THE INVENTION

The present invention is directed to apparatus and methods of operation that are further described in the following Brief Description of the Drawings, the Detailed Description of the Invention, and the claims. Other features and advantages of the present invention will become apparent from the following detailed description of the invention made with reference to the accompanying drawings.

DETAILED DESCRIPTION OF THE INVENTION

Figure 1:
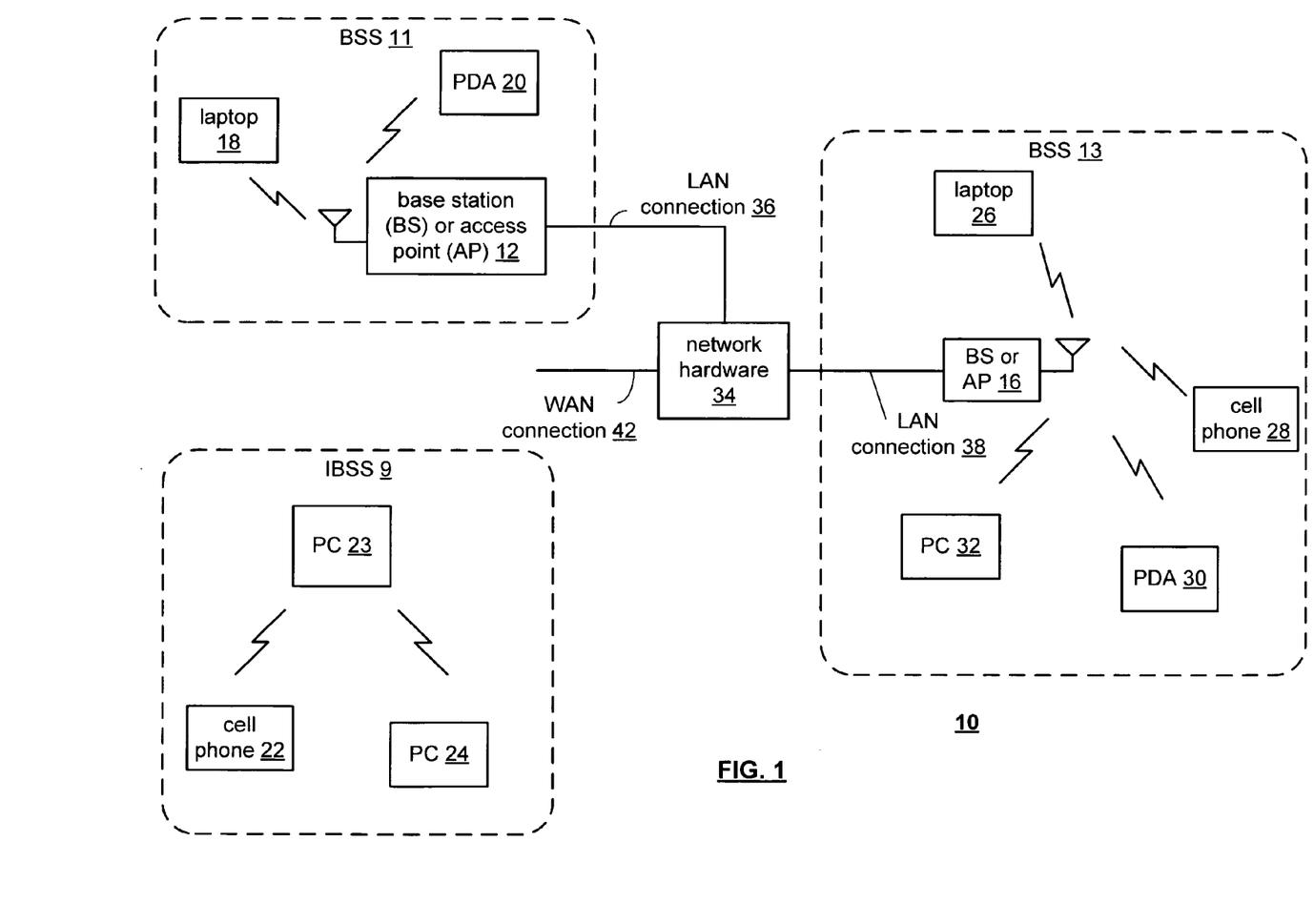
FIG. 1 is a schematic block diagram of an embodiment of a wireless communication system in accordance with the present invention.

FIG. 1 is a schematic block diagram illustrating a communication system 10 that includes a plurality of base stations and/or access points 12, 16, a plurality of wireless communication devices 18-32 and a network hardware component 34. Note that the network hardware 34, which may be a router, switch, bridge, modem, system controller, et cetera provides a wide area network connection 42 for the communication system 10. Further note that the wireless communication devices 18-32 may be laptop host computers 18 and 26, personal digital assistant hosts 20 and 30, personal computer hosts 24 and 32 and/or cellular telephone hosts 22 and 28. The details of the wireless communication devices will be described in greater detail with reference to FIGS. 2-13.

Wireless communication devices 22, 23, and 24 are located within an independent basic service set (IBSS) area and communicate directly (i.e., point to point). In this configuration, these devices 22, 23, and 24 may only communicate with each other. To communicate with other wireless communication devices within the system 10 or to communicate outside of the system 10, the devices 22, 23, and/or 24 need to affiliate with one of the base stations or access points 12 or 16.

The base stations or access points 12, 16 are located within basic service set (BSS) areas 11 and 13, respectively, and are operably coupled to the network hardware 34 via local area network connections 36, 38. Such a connection provides the base station or access point 12 16 with connectivity to other devices within the system 10 and provides connectivity to other networks via the WAN connection 42. To communicate with the wireless communication devices within its BSS 11 or 13, each of the base stations or access points 12-16 has an associated antenna or antenna array. For instance, base station or access point 12 wirelessly communicates with wireless communication devices 18 and 20 while base station or access point 16 wirelessly communicates with wireless communication devices 26-32. Typically, the wireless communication devices register with a particular base station or access point 12, 16 to receive services from the communication system 10.

Typically, base stations are used for cellular telephone systems (e.g., advanced mobile phone services (AMPS), digital AMPS, global system for mobile communications (GSM), code division multiple access (CDMA), local multi-point distribution systems (LMDS), multi-channel-multi-point distribution systems (MMDS), Enhanced Data rates for GSM Evolution (EDGE), General Packet Radio Service (GPRS), high-speed downlink packet access (HSDPA), high-speed uplink packet access (HSUPA and/or variations thereof) and like-type systems, while access points are used for in-home or in-building wireless networks (e.g., IEEE 802.11, Bluetooth, ZigBee, any other type of radio frequency based network protocol and/or variations thereof). Regardless of the particular type of communication system, each wireless communication device includes a built-in radio and/or is coupled to a radio.

Figure 2:
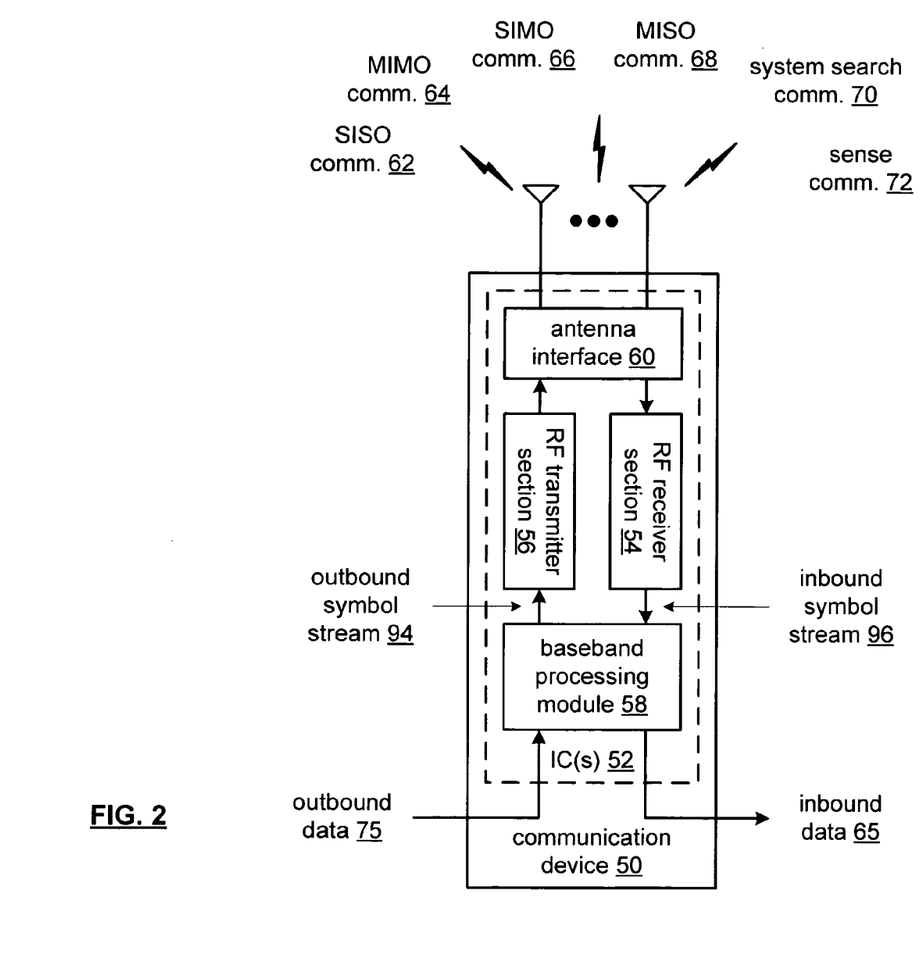
FIG. 2 is a schematic block diagram of an embodiment of a wireless communication device in accordance with the present invention.

FIG. 2 is a schematic block diagram of an embodiment of wireless communication device 50, which may be one of the communication devices 18-32 of FIG. 1 or may be another type of wireless communication device. The wireless communication device 50 includes one or more integrated circuit (IC) 52 coupled to an antenna interface 60. The one or more ICs 52 includes a radio frequency (RF) receiver section 54, an RF transmitter section 56, and a baseband processing module 58. The antenna interface 60 is coupled to an antenna system that may include one or more antennas to provide a diversity antenna structure, to provide an in-air beamforming structure, to provide a polarized antenna structure, to provide a multiple input multiple output (MIMO) communication 64 antenna structure, to provide a single input single output (SISO) communication 62 antenna structure, to provide a single input multiple output (SIMO) communication 66 antenna structure, to provide a multiple input single output (MISO0 communication 68 antenna structure, to provide a system search communication 70 (e.g., attempting authorization and/or association with a system) antenna structure, and/or to provide carrier sense communication 72 (e.g., detect an incoming wireless communication) antenna system.

The baseband processing module 58 may be a single processing device or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on hard coding of the circuitry and/or operational instructions. The processing module may have an associated memory and/or memory element, which may be a single memory device, a plurality of memory devices, and/or embedded circuitry of the processing module. Such a memory device may be a read-only memory, random access memory, volatile memory, non-volatile memory, static memory, dynamic memory, flash memory, cache memory, and/or any device that stores digital information. Note that when the processing module implements one or more of its functions via a state machine, analog circuitry, digital circuitry, and/or logic circuitry, the memory and/or memory element storing the corresponding operational instructions may be embedded within, or external to, the circuitry comprising the state machine, analog circuitry, digital circuitry, and/or logic circuitry. Further note that, the memory element stores, and the processing module executes, hard coded and/or operational instructions corresponding to at least some of the steps and/or functions illustrated in FIG. 2.

The baseband processing module 58 converts outbound data 75 (e.g., a voice signal, data, a text file, an audio file, a video file, an image file, and/or a combination thereof) into an outbound symbol stream, or streams, 94 in accordance with a wireless communication protocol (e.g., IEEE 802.11a, b, g, n, etc., Bluetooth, ZigBee, GSM, CDMA, WCDMA, EDGE, GPRS, HSDPA, HSUPA, etc.). The baseband processing module 58 also converts an inbound symbol stream, or streams, 96 into inbound data 65 (e.g., a voice signal, data, a text file, an audio file, a video file, an image file, and/or a combination thereof). Note that the baseband processing module 58 generates multiple outbound symbol streams from the outbound data when it is functioning in accordance with IEEE 802.11n, when it is performing baseband beamforming, and/or another type of multiple output communication protocol.

The RF receiver section 54 converts an inbound RF signal, or signals, into the inbound symbol stream, or streams, 96 based on a receive local oscillation. The RF transmitter section 56 is coupled to convert the outbound symbol stream, or streams, 94 into an outbound RF signal, or signals.

In an embodiment, the RF transmitter section 56 includes a power amplifier module as will be described in greater detail with reference to FIGS. 3-7. In addition, or in the alternative, the RF transmitter section 56 may include circuitry to protect the power amplifier module from damage due to mismatches when it is transmitting at higher power levels.

Figure 3:
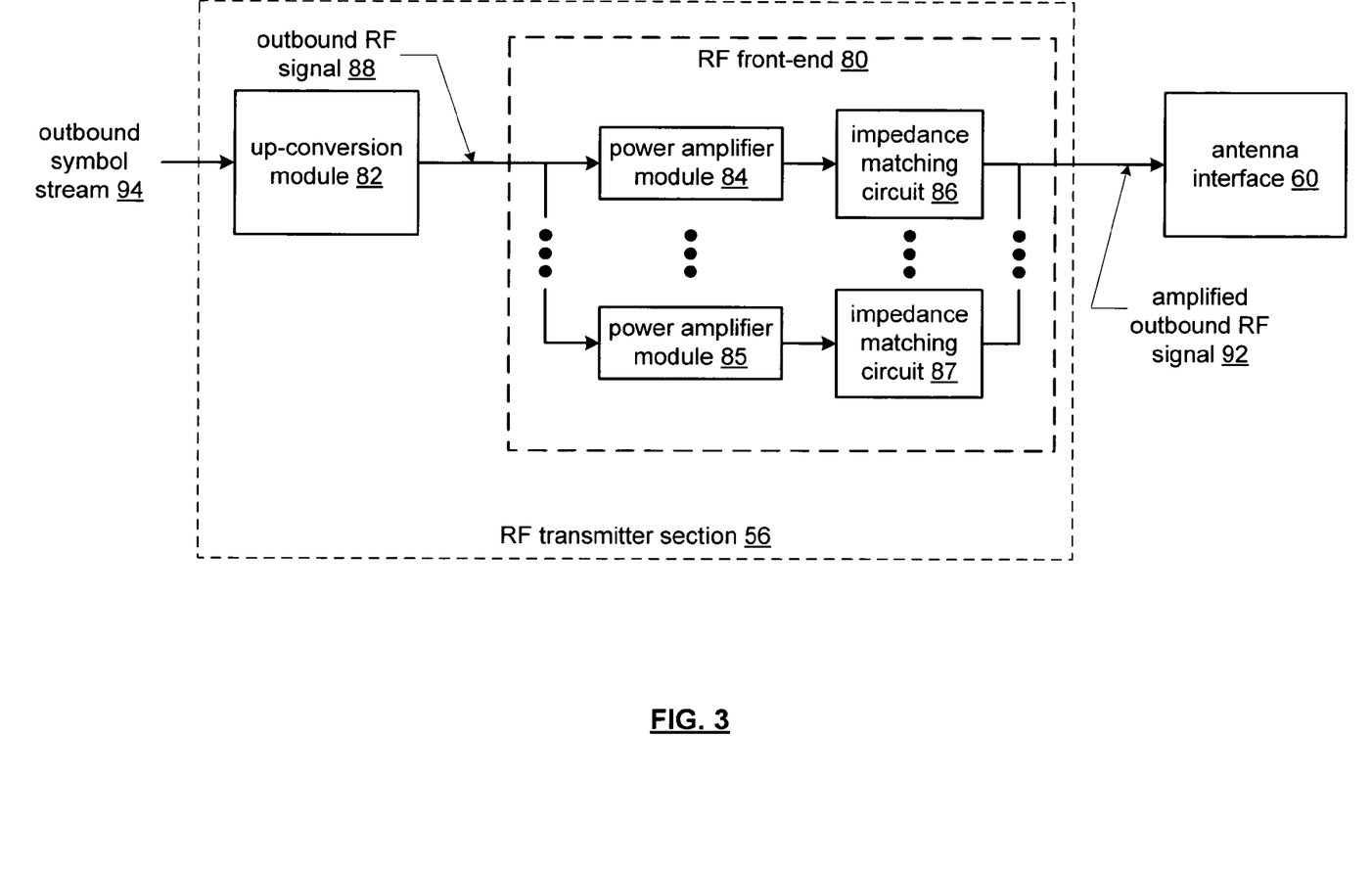
FIG. 3 is a schematic block diagram of an embodiment of an RF transmitter section in accordance with the present invention.

FIG. 3 is a schematic block diagram of an embodiment of an RF transmitter section 56 that includes an up-conversion module 82 and an RF front-end 80. The RF front-end 80 includes a plurality of power amplifier modules 84-85 and a plurality of impedance matching circuits 86-87.

The up conversion module 82 is coupled to convert the analog representation of the outbound symbol stream, or streams, 94 into an outbound RF signal, or signals, 88 based on the transmit local oscillation. In an embodiment, the up conversion module 82 may include one or more pair of mixers and a combining circuit and may further adjust its gain, its load, its frequency response, etc. in accordance with an up conversion control signal.

The power amplifier (PA) modules 84-85 (each of which may include one or more power amplifier drivers and a power amplifier) amplify the outbound RF signal 88 to produce a plurality of amplified outbound RF signals. Each of the PA modules 84-85 provides its amplified outbound RF signal to a corresponding one of the plurality of impedance matching circuits 86-87. The outputs of the impedance matching circuits 86-87 are coupled together to provide an amplified outbound RF signal 92. In this manner, an on-chip high power PA assembly is provided that can operate from low supply voltages (e.g., 1.3 volts or less) and uses an optimal resistive load (e.g., 50 Ohms or greater) such that impedance mismatches are minimal and the issues with large devices and their parasitic components are avoided. In addition, the impedance matching circuits 86-87 transfer the antenna system impedance (e.g., 50 Ohms) to the proper load at the output of each of the PA modules 84-85 (e.g., 10 Ohms or greater).

The RF front-end 80 provides the amplified outbound RF signal 92 to the antenna interface 60. In an embodiment, the antenna interface 60 includes a transmission line coupled to the common output of the impedance matching circuits 86, 87.

Figure 4:
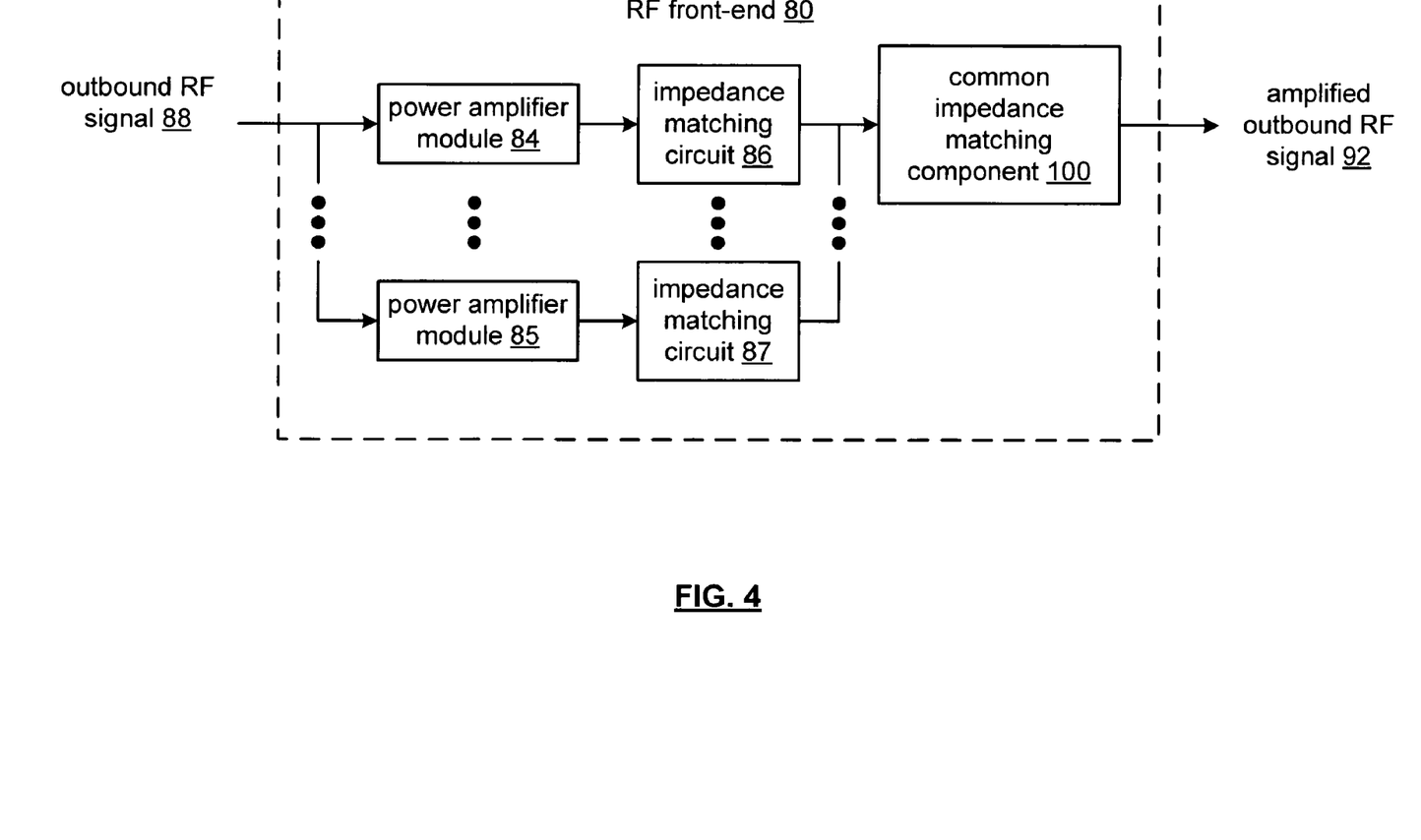
FIG. 4 is a schematic block diagram of an embodiment of an RF front-end in accordance with the present invention.

FIG. 4 is a schematic block diagram of an embodiment of an RF front-end 80 that includes a plurality of power amplifier modules 84-85, a plurality of impedance matching circuits 86-87, and a common impedance matching component 100. In this embodiment, the common impedance matching component 100 in combination with the matching circuits 86-87 provide the desired impedance matching (e.g., 50 Ohms) of the antenna system and provide the proper load at the output of each of the PA modules 84-85.

Figure 5:
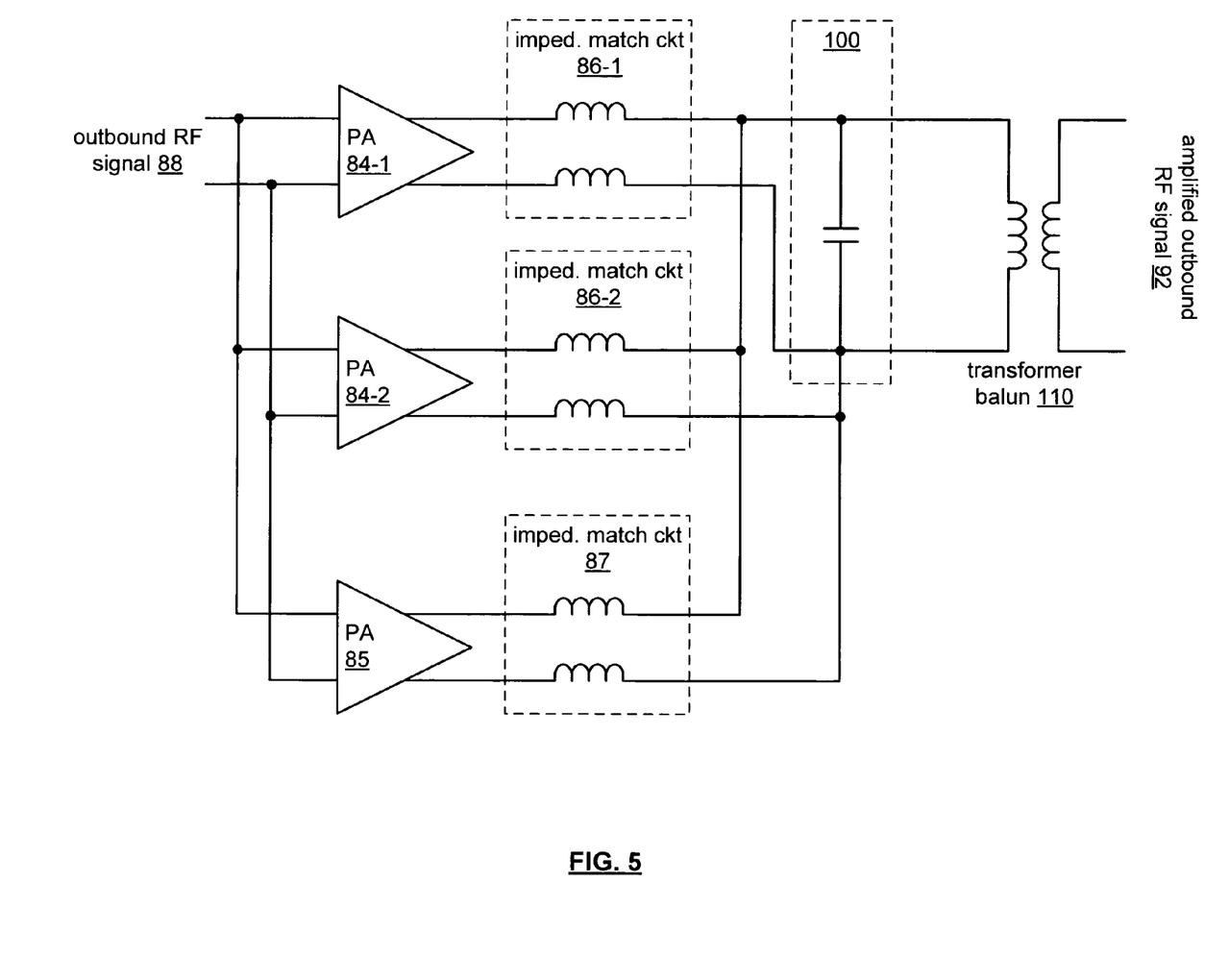
FIG. 5 is a schematic block diagram of another embodiment of an RF front-end in accordance with the present invention.

FIG. 5 is a schematic block diagram of another embodiment of an RF front-end 80 that includes a plurality of power amplifier modules 84-1, 84-2, and 85, a plurality of impedance matching circuits 86-1, 86-2, and 87, a common impedance matching component 100, and a transformer balun 110. In this embodiment, the common impedance matching component 100 is a capacitor and each of the impedance matching circuits 86-1, 86-2, and 87 includes a pair of inductors. In this manner, sizing the capacitor of the common impedance matching component 100 and sizing the inductors of the impedance matching circuits 86-1, 86-2, and 87 is dependent on the optimal effective resistive load of the power amplifier modules 84-1, 84-2, and 85 and the carrier frequency of the amplified outbound RF signal 92.

In an alternate embodiment, the plurality of power amplifier modules 84-1, 84-2, and 85 and the plurality of impedance matching circuits 86-1, 86-2, and 87 may be single-ended. In such an embodiment, the impedance matching circuits 86-1, 86-2, and 87 would each include a single inductor.

Figure 6:
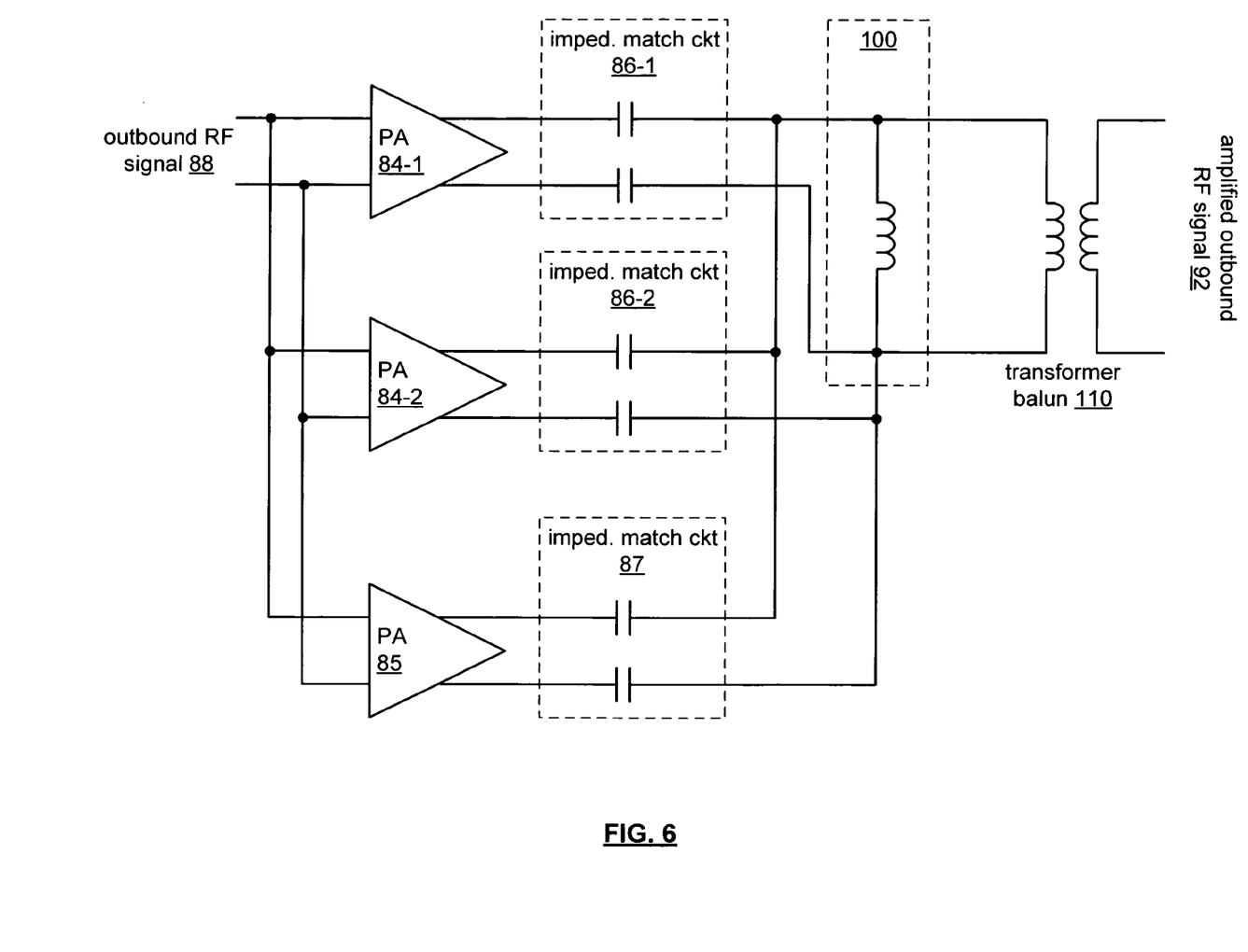
FIG. 6 is a schematic block diagram of another embodiment of an RF front-end in accordance with the present invention.

FIG. 6 is a schematic block diagram of another embodiment of an RF front-end 80 that includes a plurality of power amplifier modules 84-1, 84-2, and 85, a plurality of impedance matching circuits 86-1, 86-2, and 87, a common impedance matching component 100, and a transformer balun 100. In this embodiment, the common impedance matching component 100 is an inductor and each of the impedance matching circuits 86-1, 86-2, and 87 includes a pair of capacitors. In this manner, sizing the inductor of the common impedance matching component 100 and sizing the capacitors of the impedance matching circuits 86-1, 86-2, and 87 is dependent on the optimal effective resistive load of the power amplifier modules 84-1, 84-2, and 85 and the carrier frequency of the amplified outbound RF signal 92.

For example, if the outbound RF signal 92 has a carrier frequency within the 2.4 GHz frequency band (e.g., 1.9-2.5 GHz) and the optimal effective resistive load for each power amplifier is 20 Ohms, then the common impedance 100 inductor may have an inductance of 2 nano-Henries and each capacitor of the impedance matching circuits 86-1, 86-2, and 87 may have a capacitance of 2 pico-Farads. As one of ordinary skill in the art will appreciate, other values for the inductor and capacitors may be used for different frequencies.

In an alternate embodiment, the plurality of power amplifier modules 84-1, 84-2, and 85 and the plurality of impedance matching circuits 86-1, 86-2, and 87 may be single-ended. In such an embodiment, the impedance matching circuits 86-1, 86-2, and 87 would each include a single capacitor.

Figure 7:
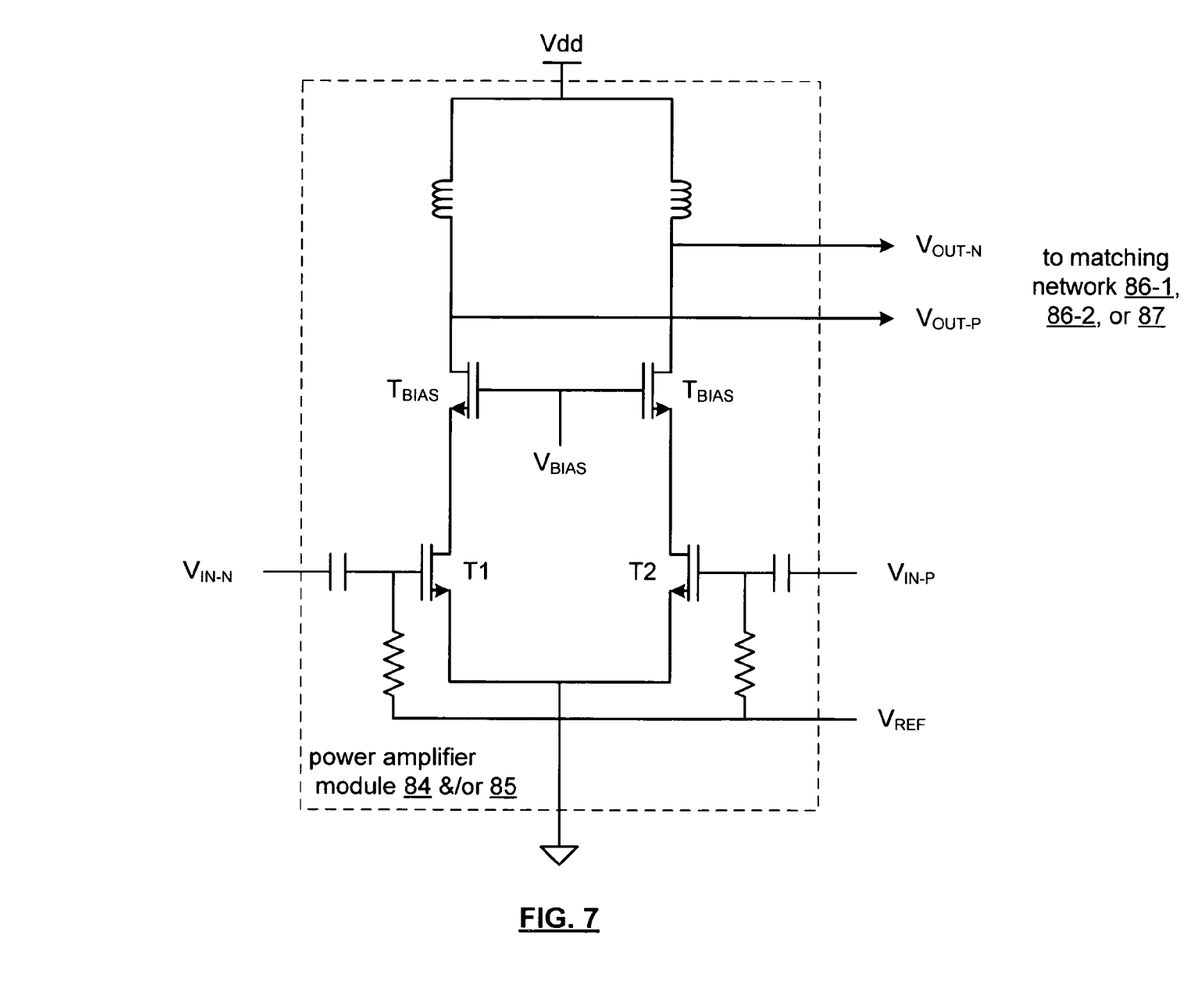
FIG. 7 is a schematic block diagram of an embodiment of a power amplifier module in accordance with the present invention.

FIG. 7 is a schematic block diagram of an embodiment of a power amplifier module 84 and/or 85 or of the power amplifier of the power amplifier module. The amplifier includes input transistors (T1 & T2), bias controlled transistors $T_{BIAS}$, a voltage reference $V_{REF}$, and inductors.

In this embodiment, bias controlled transistors (e.g., a bias controlled transistor circuit) are coupled to adjust an operating parameter of the power amplifier module. The operating parameter of the corresponding one of the plurality of power amplifiers includes one or more of gain, impedance, load, slew rate, drain or collector current, etc. In this embodiment, the power amplifier module 84 and/or 85 has an effective resistive load, which facilitates an optimal output power of the power amplifier.

As may be used herein, the terms "substantially" and "approximately" provides an industry-accepted tolerance for its corresponding term and/or relativity between items. Such an industry-accepted tolerance ranges from less than one percent to fifty percent and corresponds to, but is not limited to, component values, integrated circuit process variations, temperature variations, rise and fall times, and/or thermal noise. Such relativity between items ranges from a difference of a few percent to magnitude differences. As may also be used herein, the term(s) "coupled to" and/or "coupling" and/or includes direct coupling between items and/or indirect coupling between items via an intervening item (e.g., an item includes, but is not limited to, a component, an element, a circuit, and/or a module) where, for indirect coupling, the intervening item does not modify the information of a signal but may adjust its current level, voltage level, and/or power level. As may further be used herein, inferred coupling (i.e., where one element is coupled to another element by inference) includes direct and indirect coupling between two items in the same manner as "coupled to". As may even further be used herein, the term "operable to" indicates that an item includes one or more of power connections, input(s), output(s), etc., to perform one or more its corresponding functions and may further include inferred coupling to one or more other items. As may still further be used herein, the term "associated with", includes direct and/or indirect coupling of separate items and/or one item being embedded within another item. As may be used herein, the term "compares favorably", indicates that a comparison between two or more items, signals, etc., provides a desired relationship. For example, when the desired relationship is that signal 1 has a greater magnitude than signal 2, a favorable comparison may be achieved when the magnitude of signal 1 is greater than that of signal 2 or when the magnitude of signal 2 is less than that of signal 1.

While the transistors in the above described figure(s) is/are shown as field effect transistors (FETs), as one of ordinary skill in the art will appreciate, the transistors may be implemented using any type of transistor structure including, but not limited to, bipolar, metal oxide semiconductor field effect transistors (MOSFET), N-well transistors, P-well transistors, enhancement mode, depletion mode, and zero voltage threshold (VT) transistors.

The present invention has also been described above with the aid of method steps illustrating the performance of specified functions and relationships thereof. The boundaries and sequence of these functional building blocks and method steps have been arbitrarily defined herein for convenience of description. Alternate boundaries and sequences can be defined so long as the specified functions and relationships are appropriately performed. Any such alternate boundaries or sequences are thus within the scope and spirit of the claimed invention.

The present invention has been described above with the aid of functional building blocks illustrating the performance of certain significant functions. The boundaries of these functional building blocks have been arbitrarily defined for convenience of description. Alternate boundaries could be defined as long as the certain significant functions are appropriately performed. Similarly, flow diagram blocks may also have been arbitrarily defined herein to illustrate certain significant functionality. To the extent used, the flow diagram block boundaries and sequence could have been defined otherwise and still perform the certain significant functionality. Such alternate definitions of both functional building blocks and flow diagram blocks and sequences are thus within the scope and spirit of the claimed invention. One of average skill in the art will also recognize that the functional building blocks, and other illustrative blocks, modules and components herein, can be implemented as illustrated or by discrete components, application specific integrated circuits, processors executing appropriate software and the like or any combination thereof.

What is claimed is:

1. A radio frequency (RF) front-end comprises:
a plurality of power amplifier modules; and
a plurality of impedance matching circuits, wherein each of the plurality of impedance matching circuits includes an input connection and an output connection, wherein outputs of the plurality of power amplifier modules are coupled to corresponding input connections of the plurality of impedance matching circuits to provide a desired loading of the plurality of power amplifier modules and wherein the output connections of the plurality of impedance matching circuits are coupled together to add power of the plurality of power amplifiers.

2. The RF front-end of claim 1 further comprises:
a common impedance matching component coupling the plurality of impedance matching circuits to an antenna structure.

3. The RF front-end of claim 2, wherein the common impedance matching component comprises:
an inductor, wherein each of the plurality of impedance matching circuits includes at least one capacitor.

4. The RF front-end of claim 2, wherein the common impedance matching component comprises:
a capacitor, wherein each of the plurality of impedance matching circuits includes at least one inductor.

5. The RF front-end of claim 2 further comprises:
a transformer balun having a first winding and a second winding, wherein the first winding is coupled to an antenna and the second winding is coupled to the common impedance matching component.

6. The RF front-end of claim 1, wherein a power amplifier module of the plurality of power amplifier modules comprises:
a bias controlled transistor circuit coupled to adjust an operating parameter of the power amplifier module.

7. A radio frequency (RF) front-end comprises:
a plurality of power amplifier modules;
a plurality of impedance matching circuits, wherein each of the plurality of impedance matching circuits includes an input connection and an output connection, wherein outputs of the plurality of power amplifier modules are coupled to corresponding input connections of the plurality of impedance matching circuits to provide a desired loading of the plurality of power amplifier modules and wherein the output connections of the plurality of impedance matching circuits are coupled together to add power of the plurality of power amplifiers; and
a common impedance matching component coupling the plurality of impedance matching circuits to an antenna structure; and wherein:
the common impedance matching component includes an inductor; and
each of the plurality of impedance matching circuits includes at least one capacitor.

8. The RF front-end of claim 7 further comprises:
a transformer balun having a first winding and a second winding; and wherein:
the first winding is coupled to an antenna and the second winding is coupled to the common impedance matching component.

9. The RF front-end of claim 7, wherein a power amplifier module of the plurality of power amplifier modules comprises:
a bias controlled transistor circuit coupled to adjust an operating parameter of the power amplifier module.

10. A radio frequency (RF) front-end comprises:
a plurality of power amplifier modules;
a plurality of impedance matching circuits, wherein each of the plurality of impedance matching circuits includes an input connection and an output connection, wherein outputs of the plurality of power amplifier modules are coupled to corresponding input connections of the plurality of impedance matching circuits to provide a desired loading of the plurality of power amplifier modules and wherein the output connections of the plurality of impedance matching circuits are coupled together to add power of the plurality of power amplifiers; and
a common impedance matching component coupling the plurality of impedance matching circuits to an antenna structure; and wherein:
the common impedance matching component includes a capacitor; and
each of the plurality of impedance matching circuits includes at least one inductor.

11. The RF front-end of claim 10 further comprises:
a transformer balun having a first winding and a second winding; and wherein:
the first winding is coupled to an antenna and the second winding is coupled to the common impedance matching component.

12. The RF front-end of claim 10, wherein a power amplifier module of the plurality of power amplifier modules comprises:
a bias controlled transistor circuit coupled to adjust an operating parameter of the power amplifier module.

* * * * *